US012772487B2

(12) United States Patent
Sharma et al.

(10) Patent No.: US 12,772,487 B2
(45) Date of Patent: Oct. 20, 2026

(54) GATE-TIE-DOWN IN BACKSIDE POWER ARCHITECTURE USING CONTACT JUMPER AND BACKSIDE CONTACT

(71) Applicant: QUALCOMM Incorporated, San Diego, CA (US)

(72) Inventors: Deepak Sharma, San Diego, CA (US); Yan Sun, San Diego, CA (US); Shreesh Narasimha, Charlotte, NC (US)

(73) Assignee: QUALCOMM Incorporated, San Diego, CA (US)

( * ) Notice: Subject to any disclaimer, the term of this patent is extended or adjusted under 35 U.S.C. 154(b) by 476 days.

(21) Appl. No.: 18/469,489

(22) Filed: Sep. 18, 2023

(65) Prior Publication Data

US 2025/0098204 A1 Mar. 20, 2025

(51) Int. Cl.

| | |
|---|---|
| ***H01L 29/78*** | (2006.01) |
| ***H01L 27/02*** | (2006.01) |
| ***H01L 27/06*** | (2006.01) |
| ***H01L 29/06*** | (2006.01) |
| ***H01L 29/66*** | (2006.01) |
| ***H10D 30/01*** | (2025.01) |
| ***H10D 30/62*** | (2025.01) |
| ***H10D 62/10*** | (2025.01) |
| ***H10D 88/00*** | (2025.01) |
| ***H10D 89/10*** | (2025.01) |

(52) U.S. Cl.

CPC ....... *H10D 30/6211* (2025.01); *H10D 30/024* (2025.01); *H10D 62/119* (2025.01); *H10D 62/127* (2025.01); *H10D 88/00* (2025.01); *H10D 89/10* (2025.01)

(58) Field of Classification Search

CPC ............ H10D 30/6211; H10D 30/024; H10D 62/119; H10D 62/127; H10D 88/00; H10D 89/10; H10D 84/83; H10D 84/0149; H10D 84/038; H01L 23/485; H01L 23/5286; H01L 21/76895

USPC .......................................................... 257/401

See application file for complete search history.

(56) References Cited

U.S. PATENT DOCUMENTS

| | | | |
|---|---|---|---|
| 9,887,269 | B2 | 2/2018 | Ching et al. |
| 10,879,375 | B2 | 12/2020 | Fan et al. |
| 11,437,379 | B2 | 9/2022 | Song |
| 11,450,665 | B2 | 9/2022 | Chiang et al. |
| 11,616,015 | B2 | 3/2023 | Morrow et al. |
| 2016/0110489 | A1 | 4/2016 | Schroeder et al. |
| 2021/0407996 | A1 | 12/2021 | Agrawal et al. |
| 2022/0238725 | A1 | 7/2022 | Chiang et al. |
| 2022/0328363 | A1 | 10/2022 | Chou et al. |

(Continued)

OTHER PUBLICATIONS

International Search Report and Written Opinion—PCT/US2024/043659—ISA/EPO—Nov. 19, 2024.

*Primary Examiner* — Tong-Ho Kim

(74) *Attorney, Agent, or Firm* — MG-IP Law, P.C./Qualcomm

(57) ABSTRACT

Disclosed are gate-tie-down (GTD) cells that utilize a backside power delivery scheme, where metal wires that deliver power are provided on the back of the die. The backside power may be delivered to the gates through S/Ds and through frontside contacts. As a result, ultra-low height standard cell can be enabled. Also higher area scaling may be achieved. Further, performance and power gain can be maximized.

21 Claims, 16 Drawing Sheets

(56) References Cited

U.S. PATENT DOCUMENTS

| | | | | |
|---|---|---|---|---|
| 2022/0359369 | A1* | 11/2022 | Tsai | H10D 62/151 |
| 2023/0012680 | A1 | 1/2023 | Liaw | |
| 2023/0015572 | A1 | 1/2023 | Khaderbad et al. | |
| 2023/0058558 | A1 | 2/2023 | Bomberger et al. | |
| 2023/0086033 | A1 | 3/2023 | Xie et al. | |

* cited by examiner

GATE-TIE-DOWN IN BACKSIDE POWER ARCHITECTURE USING CONTACT JUMPER AND BACKSIDE CONTACT

FIELD OF DISCLOSURE

This disclosure relates generally to semiconductor devices, and more specifically, but not exclusively, to a novel structure to achieve gate-tie-down (GTD) in backside power (BSP) architecture using contact jumper and backside contact scheme, and fabrication techniques thereof.

BACKGROUND

Integrated circuit (IC) technology has achieved great strides in advancing computing power through miniaturization of active components. In IC technology, a cell may be viewed as a circuitry that provides a logic function such as AND, NOT, OR, etc. Gate-tie-down (GTD) enables an electrical diffusion break and avoids the need for physical diffusion break. Conventional GTD schemes normally implement frontside power designs, where the metal wires are on the front face of the wafer. Unfortunately, this generally requires wider power rails and larger/taller logic cell.

Accordingly, there is a need for systems, apparatus, and methods that overcome the deficiencies of conventional devices including the methods, system and apparatus provided herein.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

An exemplary gate-tie-down (GTD) cell is disclosed. The GTD cell may comprise a gate extending in a first direction. The gate may define an edge of the GTD cell. The GTD cell may also comprise a nano ribbon extending in a second direction different from the first direction. The nano ribbon may be formed within the gate, at least partially. The GTD cell may further comprise a backside power (BSP) rail extending in the second direction. The BSP rail may be formed below the gate and below the nano ribbon. The GTD cell may yet comprise a backside contact on and electrically coupled with the BSP rail. The GTD cell may yet further comprise a source/drain (S/D) on and electrically coupled with the backside contact. The GTD cell may in addition comprise a frontside contact on and electrically coupled with the S/D. The GTD cell may still comprise a jumper contact on and electrically coupled with the frontside contact and on and electrically coupled with the gate. The gate may be electrically coupled with the BSP rail through the jumper contact, the frontside contact, the S/D, and the backside contact.

A method of fabricating a gate-tie-down (GTD) cell is disclosed. The method may comprise forming a gate extending in a first direction. The gate may define an edge of the GTD cell. The method may also comprise forming a nano ribbon extending in a second direction different from the first direction. The nano ribbon may be formed within the gate, at least partially. The method may further comprise forming a backside power (BSP) rail extending in the second direction. The BSP rail may be formed below the gate and below the nano ribbon. The method may yet comprise forming a backside contact on and electrically coupled with the BSP rail. The method may yet further comprise forming a source/drain (S/D) on and electrically coupled with the backside contact. The method may in addition comprise forming a frontside contact on and electrically coupled with the S/D. The method may still comprise forming a jumper contact on and electrically coupled with the frontside contact and on and electrically coupled with the gate. The gate may be electrically coupled with the BSP rail through the jumper contact, the frontside contact, the S/D, and the backside contact.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

Figure 1:
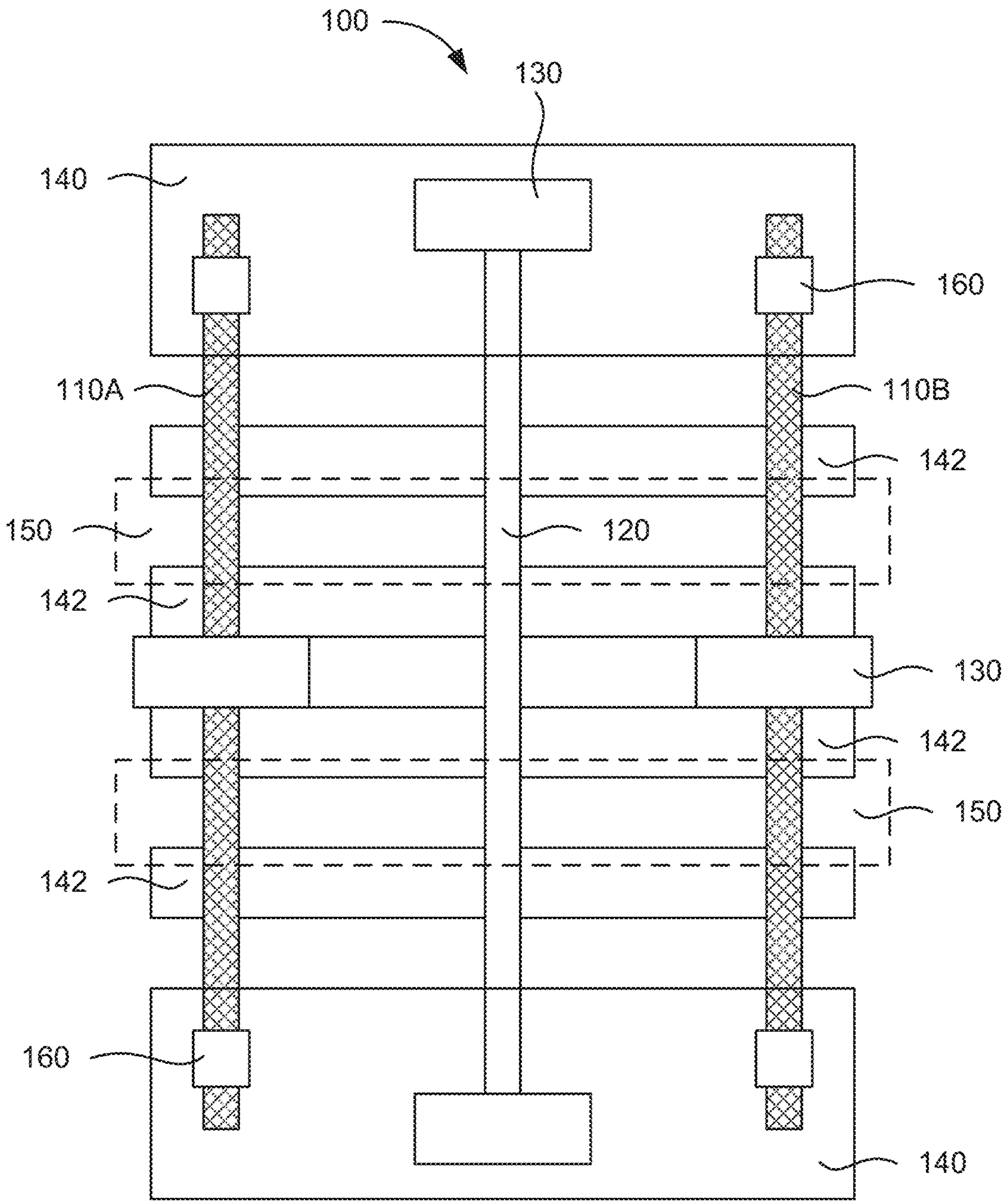
FIG. 1 illustrates a conventional gate-tie-down cell layout.

Other objects and advantages associated with the aspects disclosed herein will be apparent to those skilled in the art based on the accompanying drawings and detailed description. In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising." "includes," and/or "including." when used herein, specify the presence of stated features, integers, steps, operations, elements, and/or components, but do not preclude the presence or addition of one or more other features, integers, steps, operations, elements, components, and/or groups thereof.

As indicated above, a cell may be viewed as a circuitry that provides a logic function such as AND, NOT, OR, etc. Gate-tie-down (GTD) enables an electrical diffusion break and avoids the need for physical diffusion break. Conventional GTD schemes normally implement frontside power designs, where the metal wires are on the front face of the wafer.

FIG. 1 illustrates a standard cell layout utilizing conventional GTD scheme. As seen, a conventional cell 100 includes first and second tie-down gates 110A, 110B that extend in a vertical direction and a logic gate 120 that also extend in the vertical direction. The tie-down gates 110A, 110B may also simply be referred to as gates. The logic gate 120 is in between the first and second tie-down gates 110A, 110B. The conventional cell 100 layout also includes power rails 140 and nano ribbons 150 (shown as dashed boxes) that extend in a horizontal direction. The nano ribbons 150 are in between the power rails 140. The power rails 140 are electrically coupled with the first and second tie-down gates 110A, 110B through tie-down vias 160 (or simply vias). There are also signal rails 142. Typically, both power and signal rails 140, 142 are MO lines. The wider power rails 140 route power and the narrower signal rails 142 route signals. Gate cuts 130 illustrate areas where portions of the gates (e.g., portions of the first and second tie-down gates 110A, 110B and/or of the logic gate 120) may be cut or otherwise removed.

In FIG. 1, upper and lower boundaries of the cell 100 may be defined by the upper and lower sides of the first and second tie-down gates 110A, 110B. Also, left and right boundaries of the cell may be defined by the first and second tie-down gates 110A, 110B. That is, in an aspect, it may be said that the first and second tie-down gates 110A, 110B define boundaries, at least in part, of the cell 100. Since the first and second tie-down gates 110A, 110B define edge boundaries, they may also be referred to as first and second edge gates 110A, 110B. The cell 100 should be isolated from other cells such as neighboring cells. In the GTD scheme, isolation is achieved electrically by applying a gate turn-off voltage (or more succinctly "turn-off" voltage) to the first and second tie-down gates 110A, 110B. When the turn-off voltage is applied to the first and second tie-down gates 110A, 110B, then no conductive channels are formed in the nano ribbons 150 within the first and second tie-down gates 110A, 110B. Thus, isolation can be achieved electrically even if diffusion themselves continue outside the boundary of the cell 100. In other words, the nano ribbons 150 need NOT be physically broken. Thus, in this configuration, it is assumed that the power rails deliver the turn-off voltage. Such "electrical diffusion break" is desirable in that parametric variation is reduced when compared to cells with "physical diffusion break".

In the cell 100, which employees conventional GTD scheme, the metal wires that deliver power (e.g., Vss, Vdd) are on the front face of the wafer. In FIG. 1, this means that the power rails 140 are "above" the first and second tie-down gates 110A, 110B. As the technology scales, the cells become shorter. Unfortunately, achieving GTD with typical "frontside power" becomes more difficult. Generally, wider power rails and larger or taller logic cells are required, which is undesirable.

To address these and other issues of conventional GTD cell, it is proposed to use a backside power (BSP) trench contact jumper tie-down (TCJTD) scheme. Using this approach, scaling of cells (e.g., smaller cells) while still using GTD can be enabled. There can be significant technical advantages in using the proposed TCJTD approach to achieve GTD. They include (not necessarily exhaustive):

Enable ultra-low height standard cell;

Achieve higher area scaling; and

Maximize performance and power gain.

Figure 2:
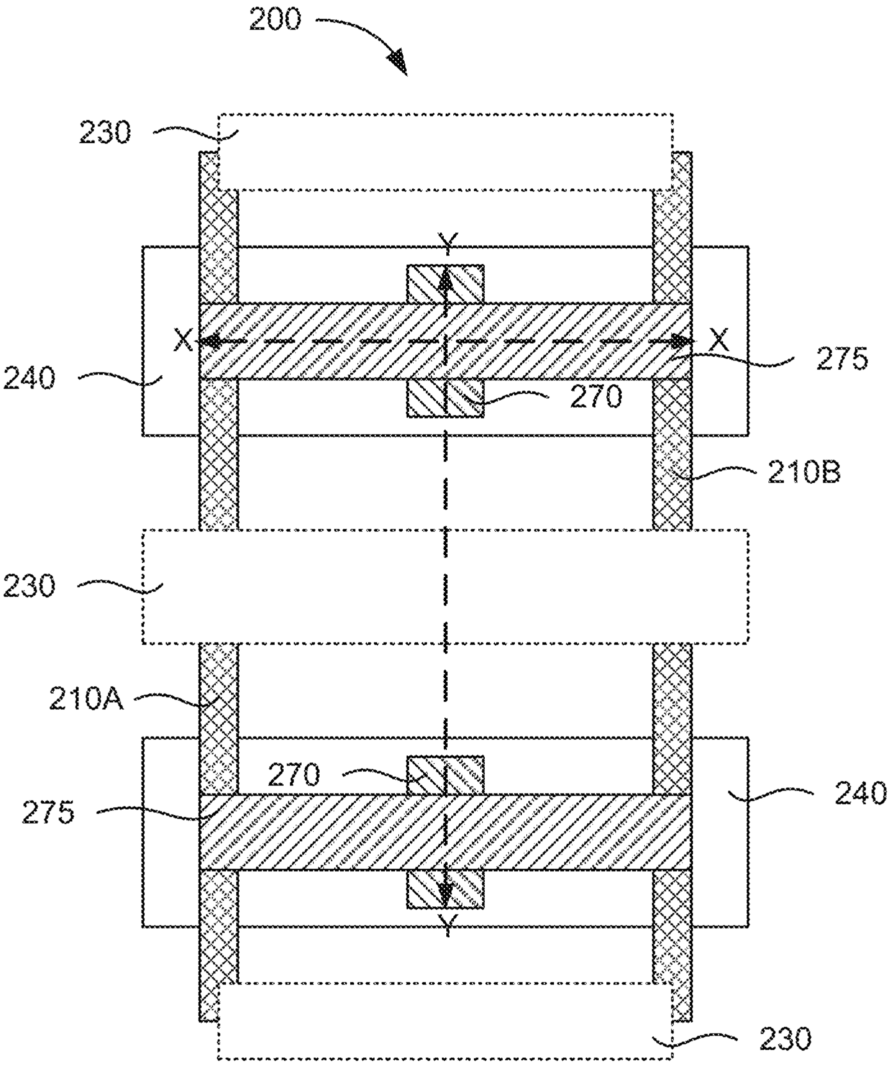
FIG. 2 illustrates an embodiment of a gate-tie-down cell layout in accordance with one or more aspects of the disclosure.
Figure 3A:
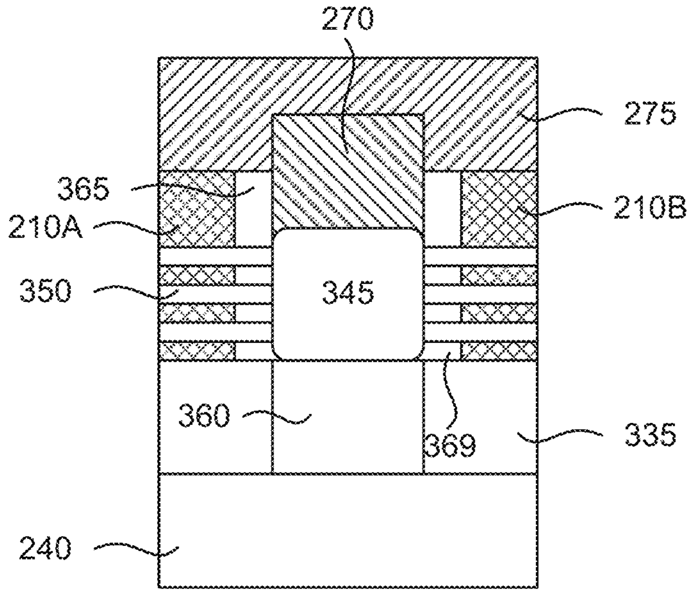
FIG. 3A-3B illustrate cross sections of the gate-tie-down cell of FIG. 2 in accordance with one or more aspects of the disclosure.
Figure 3B:
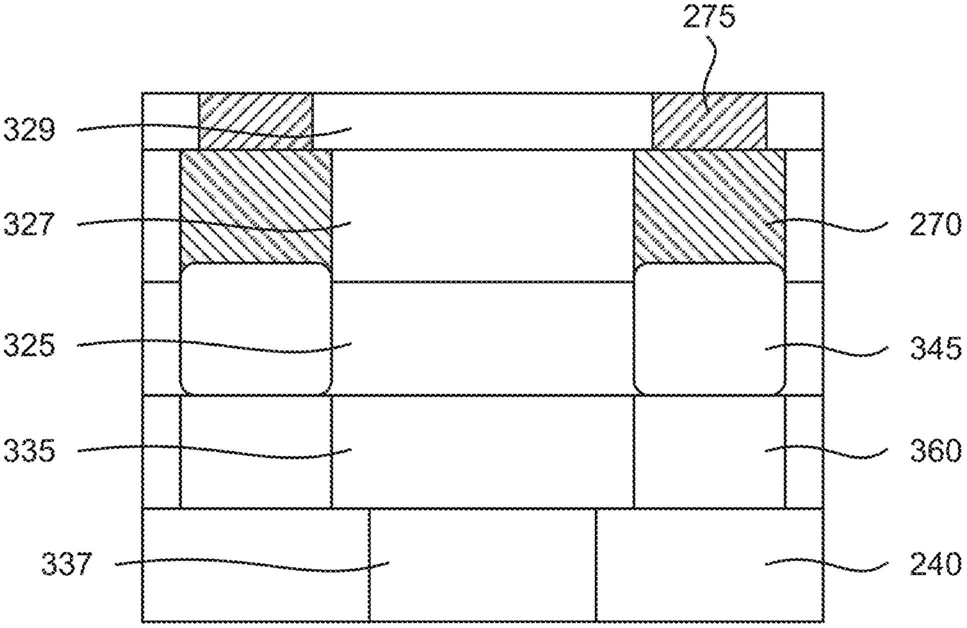

FIG. 2 illustrates an embodiment of a gate-tie-down (GTD) cell 200 in accordance with one or more aspects of the disclosure. In FIG. 2, a top view of the GTD cell 200 is shown. FIG. 3A illustrates a cross section of the GTD cell 200 along the cutline X-X in FIG. 2, and FIG. 3B illustrates a cross section of the GTD cell 200 along the cutline Y-Y in FIG. 2.

The GTD cell 200 may also be referred to as a "filler cell". The GTD cell 200 may include first and second tie-down gates 210A, 210B (individually or collectively tie-down gate(s) 210). The first and second tie-down gates 210A. 210B may be at the edges of the GTD cell 200, i.e., they may define the first and second edge boundaries (or simply "edge boundary(ies)). Hence, the first and second tie-down gates 210A, 210B may also be referred to as first and second edge gates 210A, 210B (individually or collectively edge gate(s) 210). The first and second tie-down gates 210A, 210B may extend in a first direction (e.g., vertical direction), and may be formed from metals (e.g., tungsten (W), titanium aluminide (TiAl), titanium nitride (TiN), cobalt (Co), molybdenum (Mo), etc.). Gate cuts 230 illustrate areas where portions of the gates (e.g., portions of the first and second tie-down gates 210A, 210B) may be cut or otherwise removed. In this way, shorts between power and ground may be avoided.

The GTD cell 200 may also include a nano ribbon 350 (see FIG. 3A) extending in a second direction (e.g., horizontal) different from the first direction. In an aspect, the first and second directions may be orthogonal (or substantially orthogonal) to each other. In an aspect, the nano ribbon 350 may be formed within the first and second tie-down gates 210A, 210B, at least partially. The nano ribbons 350 may be formed from silicon (Si) or other semiconductor materials such as silicon germanium (SiGe), gallium arsenide (GaAs), and so on. The GTD cell 200 may be a fin-shaped field effect transistor (FinFET) cell. That is, the nano ribbons 350 may be fins of a FinFET device. Alternatively, the GTD cell 200 may be a gate all around (GAA) cell. That is, the nano ribbons 350 may be nanosheets of a GAA device.

The GTD cell 200 may further include one or more backside power (BSP) rails 240 that extend the second direction (e.g., see FIG. 3A). The BSP rails 240 may be placed below the first and second tie-down gates 210A, 210B. The BSP rails 240 may also be placed below the nano ribbon 350. The BSP rails 240 may be formed from metals such as copper (Cu), cobalt (Co), tungsten (W), molybdenum (Mo), ruthenium (Ru), titanium aluminide (TiAl), titanium nitride (TiN), etc.

A backside contact 360 may be formed on and electrically coupled with the BSP rail 240. For example, the backside contact 360 may be in direct contact with the BSP rail 240. The backside contact 360 may be formed from conductive materials including W, TiAl, TiN, Co, Mo, etc.

A tie-down source/drain (S/D) 345 (or simply S/D 345) may be formed on and electrically coupled with the backside contact 360. For example, the tie-down S/D 345 may be in direct contact with the backside contact 360. In an aspect, the tie-down S/D 345 may be coupled with the nano ribbon 350. For example, the tie-down S/D 345 and the nano ribbon 350 may be in contact with each other. In normal operation, the coupling between the tie-down S/D 345 and the nano ribbon 350 may not be electrical. As will be shown further below, in normal operation, the nano ribbon 350 within the first and second tie-down gates 210A. 210B may be prevented from being activated. The tie-down S/D 345 may be similar to the sources/drains grown from the nano ribbon 350 for logic functions. That is, the tie-down S/D 345 may be epitaxial.

A frontside contact 270 may be formed on and electrically coupled with the tie-down S/D 345. For example, the frontside contact 270 may be in direct contact with the tie-down S/D 345. The frontside contact 270 may be formed from conductive materials including W. TiAl, TiN, Co, Mo, etc.

A jumper contact 275 may be formed on and electrically coupled with the frontside contact 270. For example, the jumper contact 275 may be in direct contact with the frontside contact 270. The jumper contact 275 may also be formed on and electrically coupled with the first and/or the second tic-down gates 210A, 210B. For example, the jumper contact 275 may be in direct contact with the first and/or second tie-down gates 210A, 210B. The jumper contact 275 may be formed from metals such as W, TiAl, TiN, Co, Mo, etc.

As seen, the backside contact 360, the tie-down S/D 345, and the frontside contact 270 may be horizontally in between the first and second tie-down gates 210A, 210B.

In an aspect, the first and/or the second tie-down gates 210A, 210B may be electrically coupled with the BSP rail 240 through the jumper contact 275, the frontside contact 270, the tie-down S/D 345, and the backside contact 360.

The BSP rails 240 may be configured to apply a turn-off voltage (e.g., one of Vss and Vdd) to the first and second tie-down gates 210A, 210B through the backside contact 360, the tic-down S/D 345, the frontside contact 270, and the jumper contact 275. As a result, the GTD cell 200 may be isolated from other cells, including neighboring cells that abut the GTD cell 200.

For ease of reference, a portion of the nano ribbon 350 within the first tie-down gate 210A may be referred to as a first gate portion. Also, a channel that may be activated in the first gate portion may be referred to as a first channel. Similarly, a portion of the nano ribbon 350 within the second tie-down gate 210B may be referred to as a second gate portion, and a channel that may be activated therein may be referred to as a second channel. The first and second gate portions may be generically referred to as gate portions and the first and second channels may be generically referred to as channels.

Recall from above that BSP rail 240 is configured to apply the turn-off voltage to the first and second tie-down gates 210A, 210B (through the backside contact 360, the tie-down S/D 345, the frontside contact 270, and the jumper contact 275). Accordingly, it then may be said that the first gate portion of the nano ribbon 350 is configured to prevent the first channel being activated therein when the turn-off voltage is applied to the first tie-down gate 210A. Thus, when the turn-off voltage is applied from the BSP rail 240, the first gate portion may electrically isolate a first inside portion from a first outside portion. The first inside portion may be a portion of the GTD cell 200 immediately inside of the first gate portion, and the first outside portion may be a portion of a cell (e.g., a cell that neighbors the GTD cell 200) immediately outside the first gate portion.

Similarly, it may be said that the second gate portion of the nano ribbon 350 is configured to prevent the second channel being activated therein when the turn-off voltage is applied to the second tie-down gate 210B. Thus, when the turn-off voltage is applied from the BSP rail 240, the second gate portion may electrically isolate a second inside portion from a second outside portion. The second inside portion may be a portion of the GTD cell 200 immediately inside of the second gate portion, and the second outside portion may be a portion of a cell (e.g., another cell that neighbors the GTD cell 200) immediately outside the second gate portion.

Generically, it may be said that the gate portion of the nano ribbon 350 is configured to prevent the channel being activated therein when the turn-off voltage is applied to the tie-down gate 210. When the turn-off voltage is applied from the BSP rail 240, the gate portion may electrically isolate an inside portion from an outside portion. The inside portion may be a portion of the GTD cell 200 immediately inside of the gate portion, and the outside portion may be a portion of a cell (e.g., a cell that neighbors the GTD cell 200) immediately outside the gate portion.

As indicated, FIG. 3B illustrates a cross section of the GTD cell 200 along the cutline Y-Y in FIG. 2. This cross sectional view reinforces the concept that the BSP rails 240, the backside contacts 360, the tie-down S/D 345, the frontside contacts 270, and the jumper contacts 275 are electrically coupled. As seen in FIG. 3B, the GTD cell 200 may include first and second backside dielectrics 335, 337 and first, second, and third dielectrics 325, 327, 329. The second backside dielectric 337 may be encapsulate sides of the BSP rail 240, the first backside dielectric 335 may encapsulate the sides of the backside contact 360, the first dielectric 325 may encapsulate sides of the tie-down S/D 345, the second dielectric 327 may encapsulate sides of the frontside contact 270, and the third dielectric 329 may encapsulate sides of the jumper contact 275.

Figure 4A:
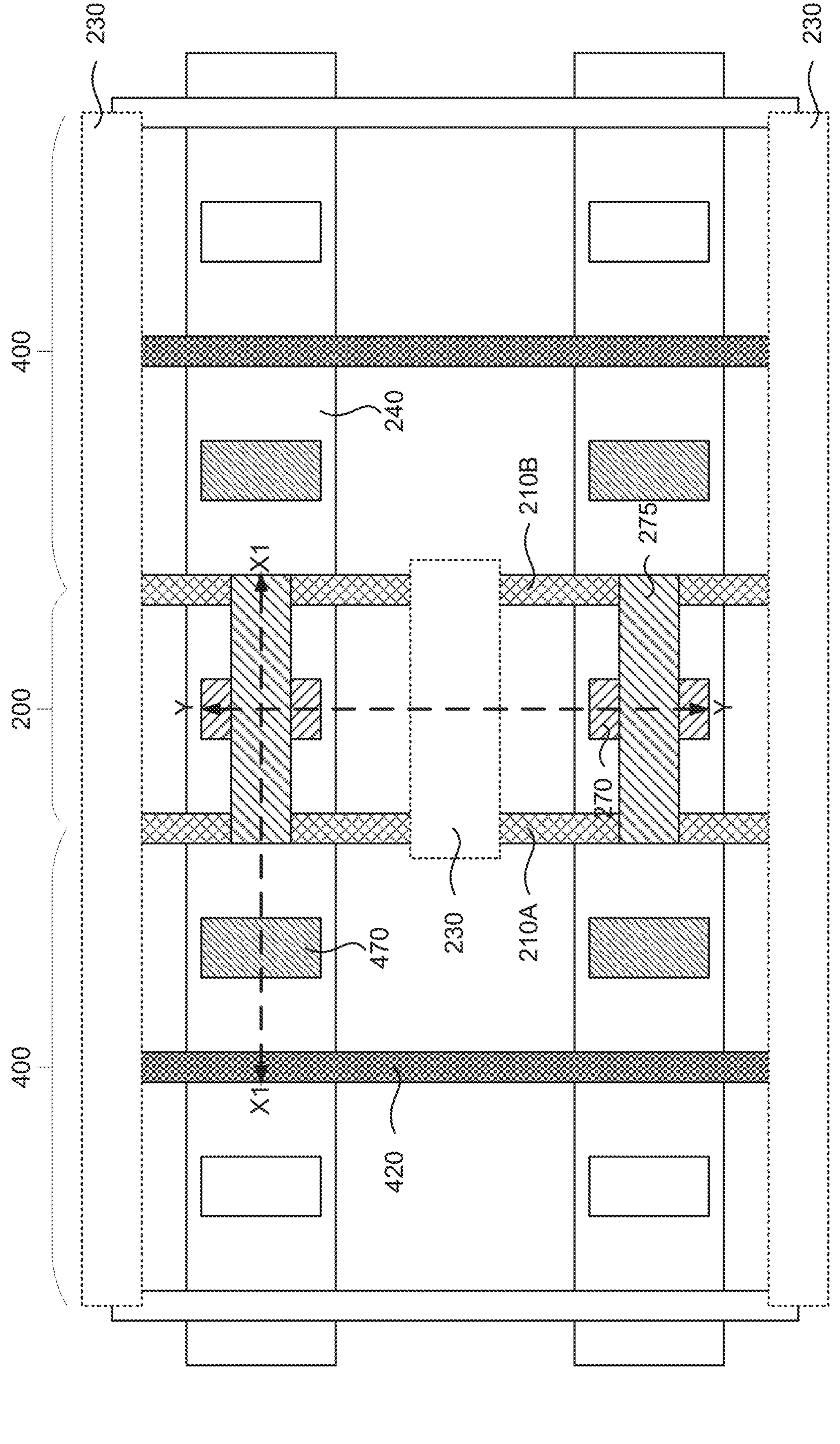
FIG. 4A illustrates an example layout of adjoining logic cells to the gate-tie-down cell of FIG. 2 in accordance with one or more aspects of the disclosure.

FIG. 4A illustrates adjoining logic cells to the gate-tie-down cell of FIG. 2 in accordance with one or more aspects of the disclosure. In particular, FIG. 4A illustrates an example layout of using the GTD cell 200 (i.e., filler cell 200) to electrically isolate two logic cells 400 from each other. As seen, one logic cell 400 may adjoin or abut the GTD cell 200 on one side (e.g., left), and another logic cell 400 may adjoin or abut the GTD cell 200 on other side (e.g., right). In this instance, it may be assumed that a diffusion (not shown in FIG. 4A) is continuous through each of the gates of the left logic cell 400 (e.g., logic gate 420), of the GTD cell 200 (e.g., first and second tie-down gates 210A, 210B), and of the right logic cell 400 (logic gate 420). Nonetheless, since channels are NOT activated in the nano ribbon 350 at the first and second tie-down gates 210A, 210B, the left and right logic cells 400 may be electrically isolated from each other.

Figure 4B:
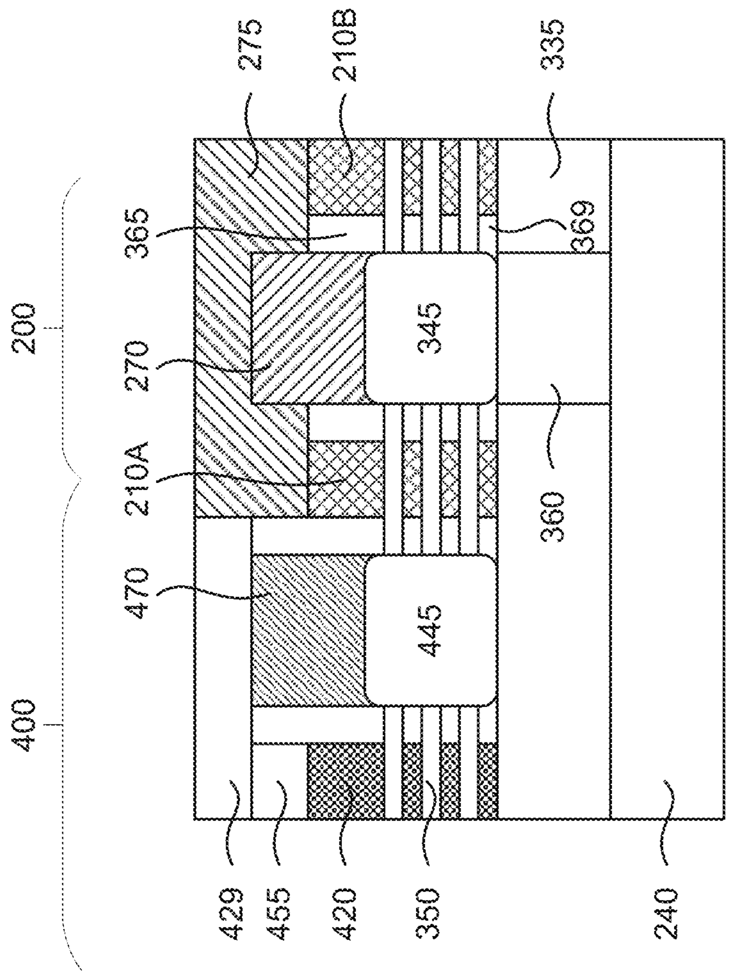
FIG. 4B illustrates a cross section of a combination of the logic cells and the gate-tie-down cell shown in FIG. 4A in accordance with one or more aspects of the disclosure.

FIG. 4B illustrates a cross section of a combination of the logic cells 400 and the GTD cell 200 along the cutline X1-X1 in FIG. 4A. The logic cell 400 may include the BSP rail 240, the nano ribbon 350, a logic gate 420, a gate hard mask 455 on the logic gate 420, and a dielectric 429 on the gate hard mask 455. The logic cell 400 may also include a source/drain (S/D) 445, which may be epitaxially grown from the nano ribbon 350, and a logic contact 470 on the S/D 445. The logic contact 470 may be electrically coupled with the S/D 445 (e.g., the S/D 445 and the logic contact 470 may be in direct contact with each other). The logic contact 470 may be formed from materials similar to the frontside contact 270.

While the first and second tie-down gates 210A, 210B may only receive the turn-off voltage (e.g., one of Vss and Vdd), the logic gate 420 may receive the turn-off or a turn-on voltage (e.g., Vss or Vdd). For ease of reference, a portion of the nano ribbon within the logic gate 420 may be referred to as a logic portion. Also, a channel that may be activated or otherwise formed in the logic portion may be referred to as logic channel. When the turn-on voltage is applied to the logic gate 420, then the logic channel may be activated. Conversely, when the turn-off voltage is applied the logic gate 420, then the logic channel may be prevented from being activated. Note that the BSP rail 240 need NOT be coupled with the S/D 445.

Note that the nano ribbon 350 exists both the logic cell 400 and the GTD cell 200. Nonetheless, since there are no channels activated within the first and second tie-down gates 210A, 210B, the logic cell 400 may be isolated from other logic cells.

Note that FIG. 4A also has a vertical cutline Y-Y. In this instance, the cross-sectional view illustrated in FIG. 3B may be applicable to the cross section along the cutline Y-Y of FIG. 4A.

Figure 5A:
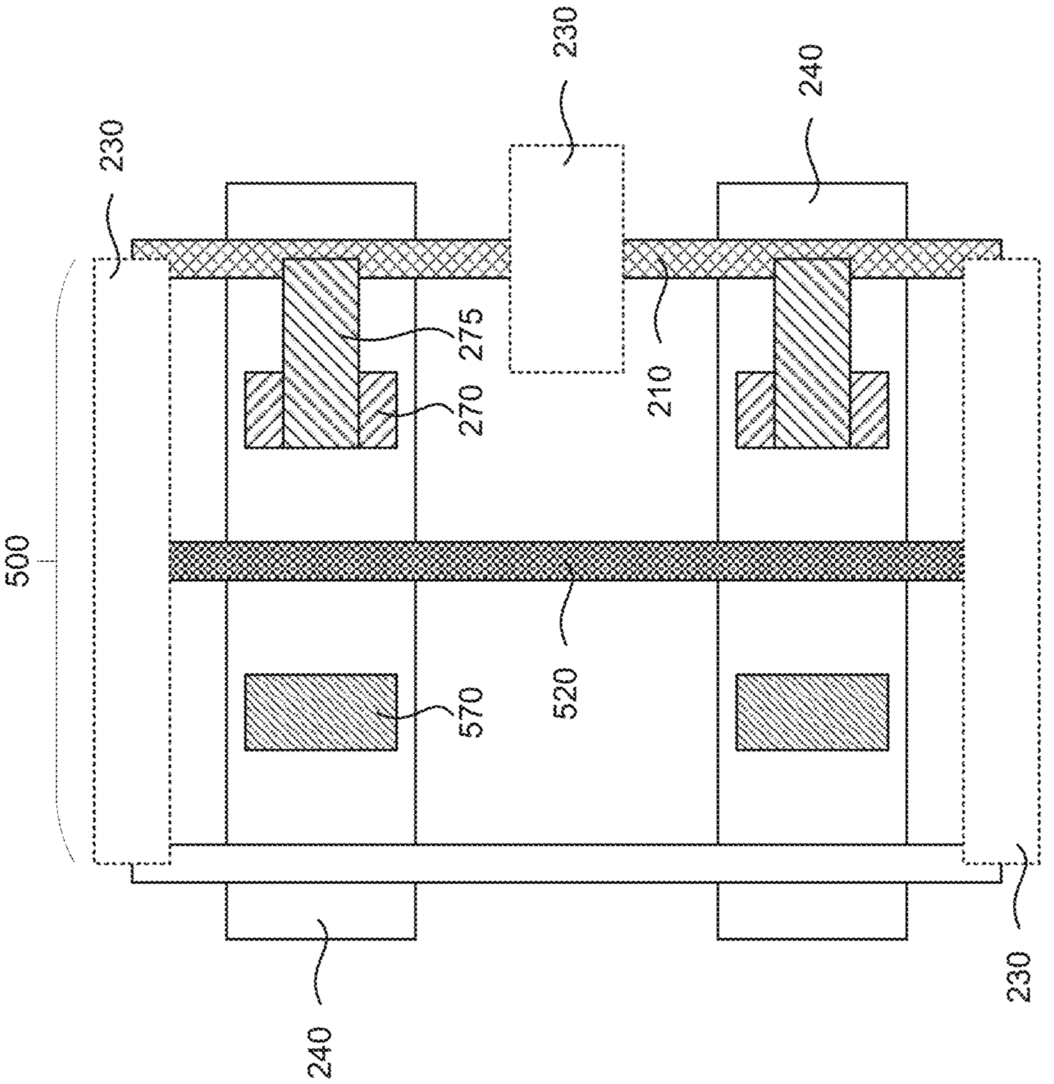
FIG. 5A illustrates another embodiment of a gate-tie-down cell layout in accordance with one or more aspects of the disclosure.

FIG. 5A illustrates another embodiment of a GTD cell in accordance with one or more aspects of the disclosure. In this instance, the GTD cell 500 may be a logic cell. It may be assumed that the logic performed by the GTD cell 500 enables a boundary edge gate to be tied down to a turn-off voltage. That is, a boundary gate (right gate in FIG. 5A) may be a tie-down gate 210 (similar to first and second tie-down gates 210A, 210B of FIG. 2). As seen, the GTD cell 500 may include the BSP rails 240, the frontside contacts 270, and the jumper contacts 275. These have been described above with respect to FIGS. 2, 3A, and 3B. Therefore, detailed descriptions thereof will not be repeated for sake of brevity.

The GTD cell 500 may include a logic gate 520, which may extend in the second direction. The logic gate 520 may be formed from materials similar to the materials of the tie-down gate 210. The GTD cell may further include logic contacts 570, which may be formed from materials similar to the materials of the frontside contacts 270. In an aspect, the logic gate 520 may be horizontally in between the frontside contact 270 and the logic contact 570.

Figure 5B:
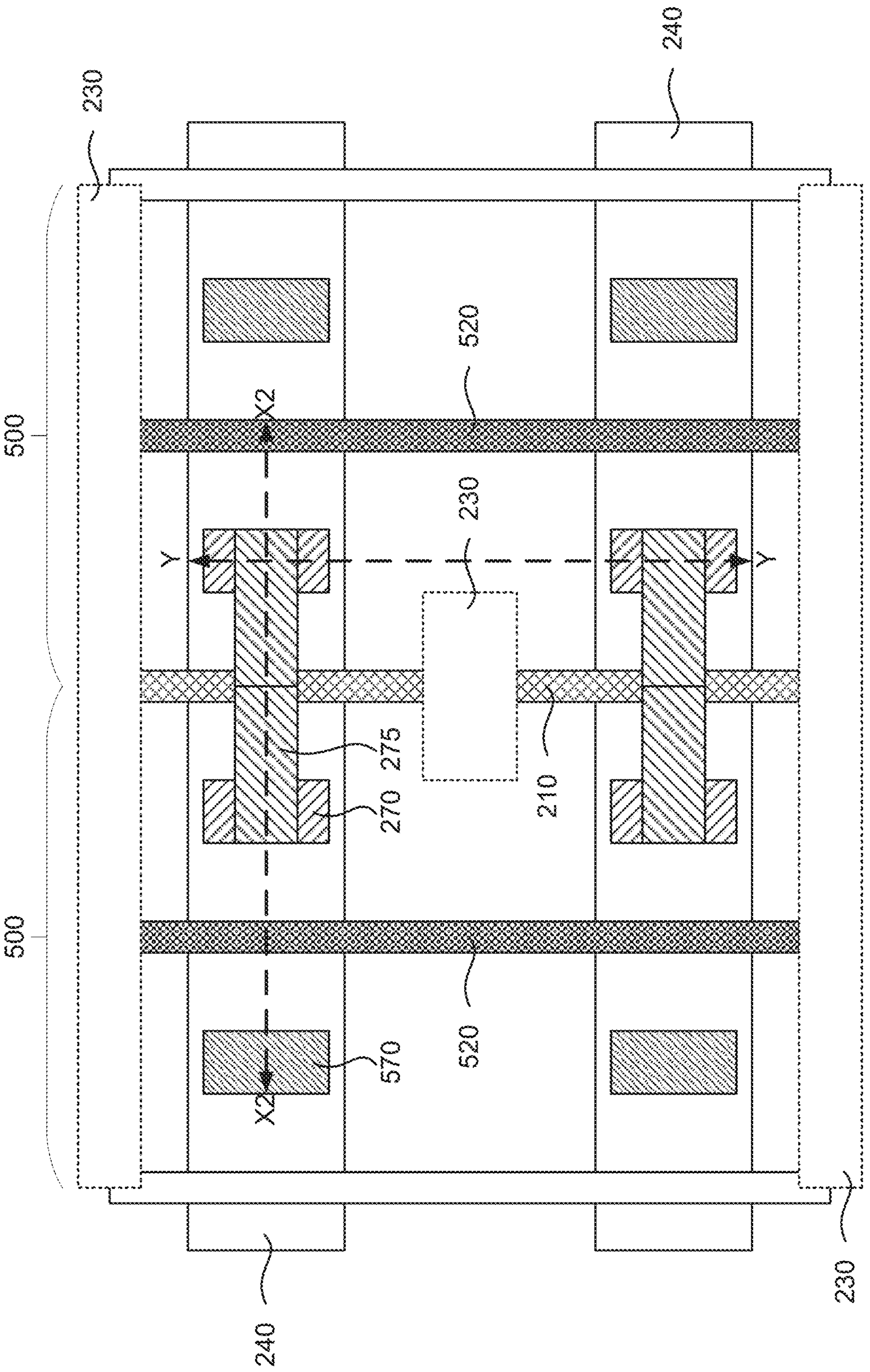
FIG. 5B illustrates an example layout of adjoining multiple gate-tie-down cells of FIG. 5A in accordance with one or more aspects of the disclosure.

As illustrated in FIG. 5B, two such GTD cells 500 may abut each other. In FIG. 5B, a GTD cell 500 (e.g., left GTD logic cell) may be configured to abut another GTD cell 500 (e.g., right GTD logic cell) such that the tie-down gate 210 is a common tie-down gate 210 to the GTD cell 500 and to the another GTD cell 500. The another GTD cell 500 may also include the BSP rails 240, the frontside contacts 270, and the jumper contacts 275. The BSP rails 240 may be physically continuous in both GTD cells 500.

Figure 5C:
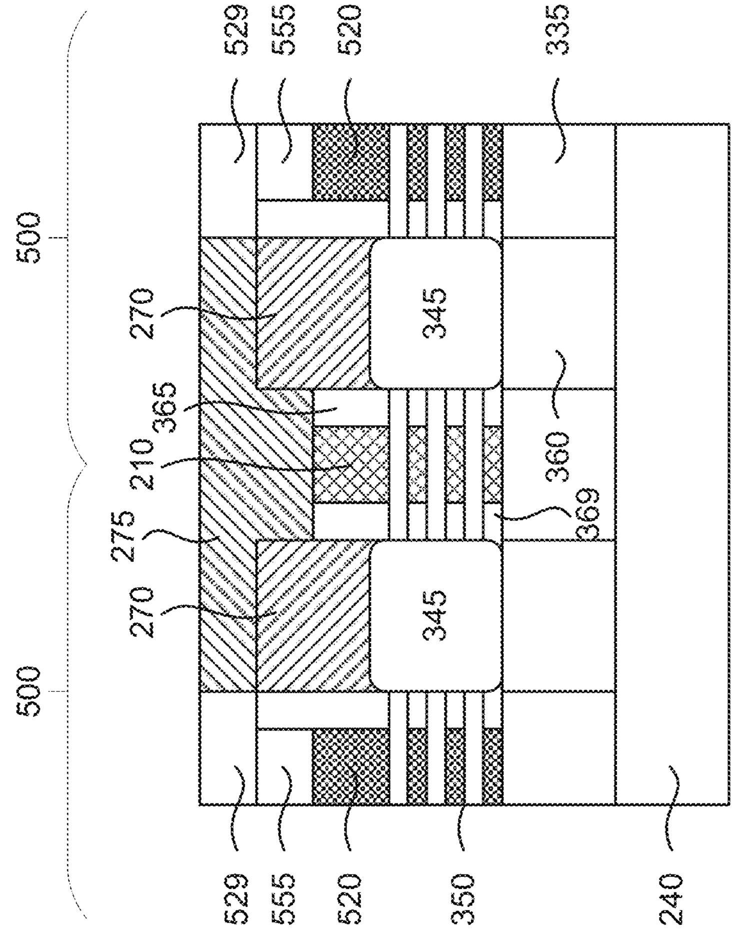
FIG. 5C illustrates a cross section of a combination of the multiple gate-tie-down cells in accordance with one or more aspects of the disclosure.

FIG. 5C illustrates a cross section of a combination of the GTD cells 500 along the cutline X2-X2 in FIG. 5B. As seen the GTD cell 500 (e.g., the left GTD cell) and the another GTD cell 500 (e.g., the right GTD cell) may each include a logic gate 520, a gate hard mask 555 on the logic gate 520, and a dielectric 529 on the gate hard mask 555. The logic gates 520 may extend in the second direction (e.g., see FIGS. 5A, 5B). Each GTD cell 500 may include a backside contact 360 on and electrically coupled with the BSP rail 240, a tie-down S/D 345 on and electrically coupled with the backside contact 360, and a frontside contact 270 on and electrically coupled with the tie-down S/D 345. A common jumper contact 275 may be on and electrically coupled with both frontside contacts 270.

In the GTD cell 500 (left GTD cell 500), the backside contact 360, the tie-down S/D 345, and the frontside contact 270 may be horizontally in between the tie-down gate 210 and the logic gate 520. Again for ease of reference, a portion of the nano ribbon 350 within the logic gate 520 may be referred to a logic portion. Also, a channel that may be activated or otherwise formed in the logic portion may be referred to as a logic channel. When the turn-on voltage is applied to the logic gate 520, then the logic channel may be activated. Conversely, when the turn-off voltage is applied the logic gate 520, then the logic channel may be prevented from being activated. Note that the logic gate 520 need NOT be coupled with the BSP rail 240.

In the another GTD cell 500 (right GTD cell 500), another backside contact 360, another tie-down S/D 345, and another frontside contact 270 may be horizontally in between the tie-down gate 210 and another logic gate 520. Note that the nano ribbon 350 and the another tie-down S/D 345 may be coupled with each other. For example, the another tie-down S/D 345 and the nano ribbon 350 may be in contact with each other. In normal operation, the coupling between the another tie-down S/D 345 and the nano ribbon 350 may not be electrical. For ease of reference, a portion of the nano ribbon 350 within the another logic gate 520 may be referred to another logic portion. Also, a channel that may be activated or otherwise formed in the another logic portion may be referred to as another logic channel. When the turn-on voltage is applied to the another logic gate 520, then the another logic channel may be activated. Conversely, when the turn-off voltage is applied the another logic gate 520, then the another logic channel may be prevented from being activated. Note that the another logic gate 520 need NOT be coupled with the BSP rail 240.

FIGS. 6A-6J illustrate examples of stages of fabricating a GTD cell, such as the GTD cell 200. While stages related to fabricating the GTD cell 200 are illustrated, it should be relatively straight to determine the processing steps to fabricate the cell 500 from these illustrations.

Figure 6A:
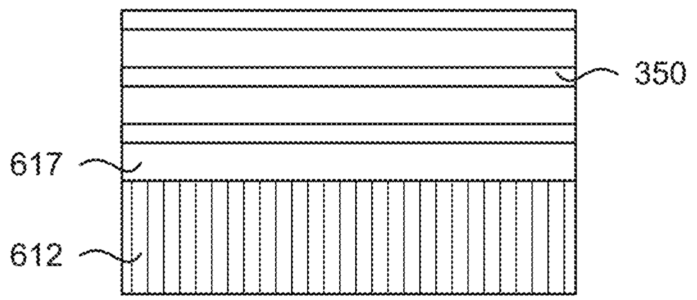
FIGS. 6A-6J illustrate examples of stages of fabricating a gate-tie-down cell in accordance with one or more aspects of the disclosure.

FIG. 6A illustrates a stage in which a substrate 612 (e.g., a carrier) may be provided. Then alternating dummy layers 617 (e.g., layers of SiGe) and nano ribbons 350 may be provided on the substrate 612. In an aspect, the substrate 612, the dummy layers 617, and the nano ribbons 350 may be a portion of a nanosheet wafer.

Figure 6B:
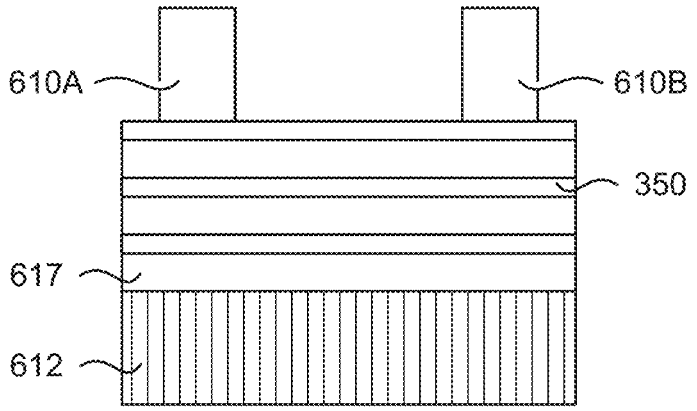

FIG. 6B illustrates a stage in which dummy gates—first and second dummy gates 610A, 610B—may be formed on the nano ribbon 350 (e.g., of the nanosheet wafer).

Figure 6C:
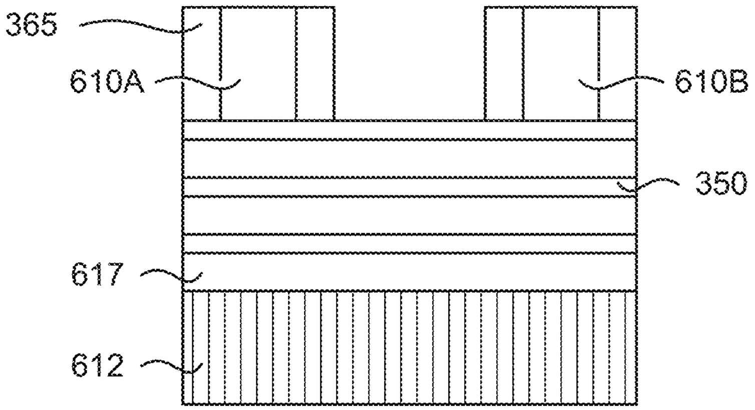

FIG. 6C illustrates a stage in which the spacers 365 may be formed on the sides of the first and second dummy gates 610A, 610B.

Figure 6D:
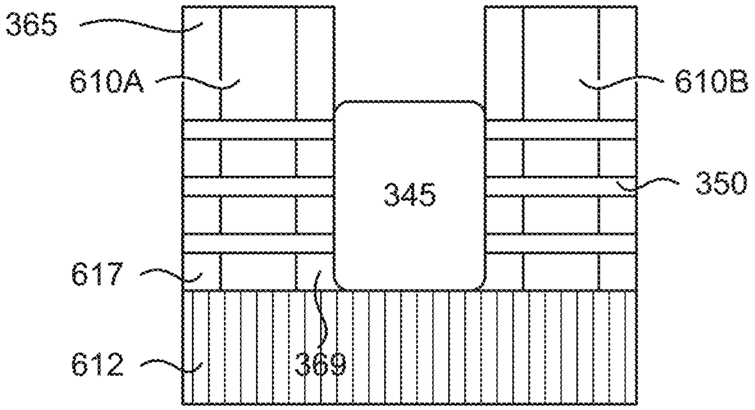

FIG. 6D illustrates a stage in which a tie-down S/D 345 may be formed on the substrate 612 between the first and second dummy gates 610A, 610B. For example, a recess may be formed in the nanosheet wafer between the dummy gates 610A, 610B. The recess may expose the substrate 612. The tie-down S/Ds 345 may be formed on the substrate 612. For example, the tie-down S/Ds 345 may be epitaxially grown from the nano ribbons 350. Inner spacers 369 may also be formed on sides of the tie-down S/Ds 345. For example, the inner spacers 369 may be formed around the wrap-around gate (e.g., the first and second dummy gates 610A, 610B) in between the nano ribbons 350. The nano ribbons 350 may be in contact with the tie-down S/Ds 345.

Figure 6E:
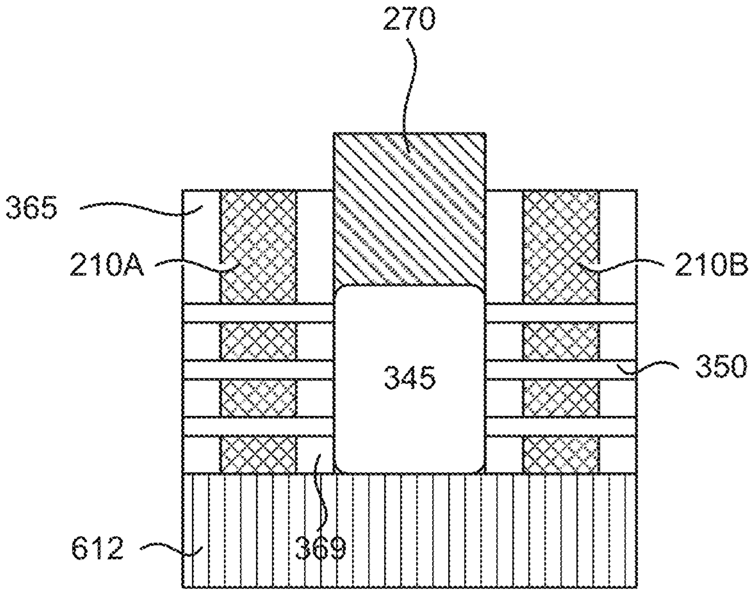

FIG. 6E illustrates a stage in which the dummy gates 610A, 610B may be released. In their place, the first and second tie-down gates 210A, 210B may be formed. For example, after the dummy gates 610A, 610B are released, this may be followed with gate dielectric and gate metal deposition to form the first and second tie-down gates 210A, 210B. The metal deposition may also form the frontside contacts 270 on the tie-down S/D 345.

Figure 6F:
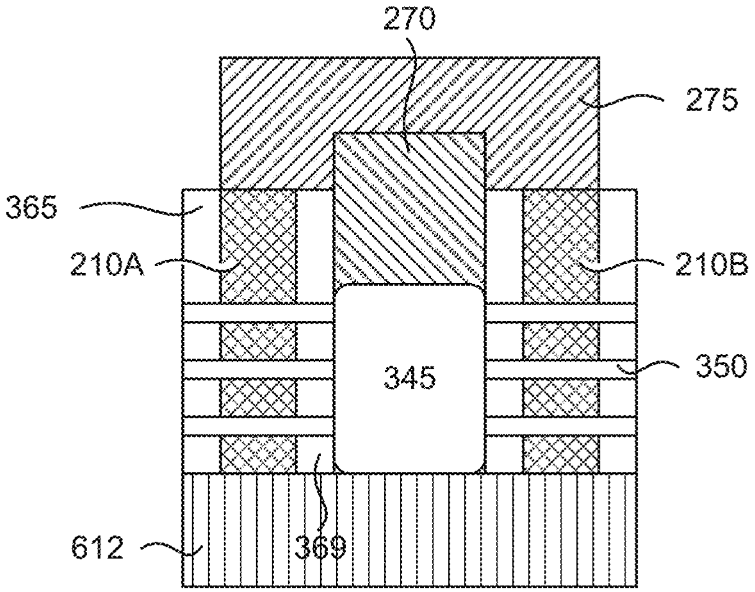

FIG. 6F illustrates a stage in which the jumper contact 275 may be formed to electrically couple the first and second tie-down gates 210A, 210B with the frontside contact 270.

Figure 6G:
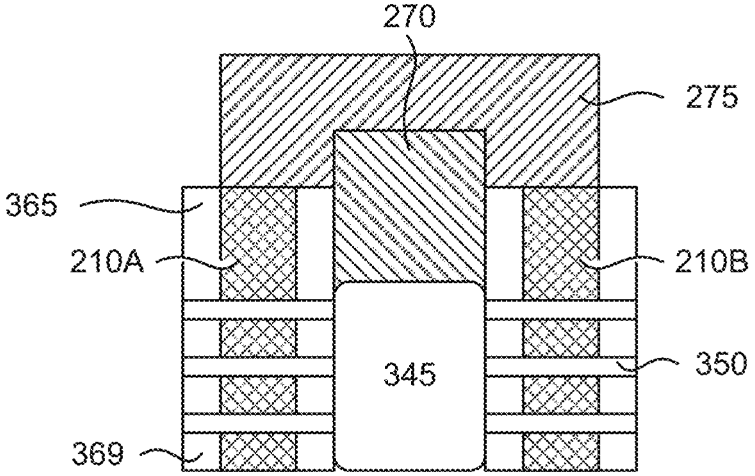

FIG. 6G illustrates stage in which the substrate 612 may be removed.

Figure 6H:
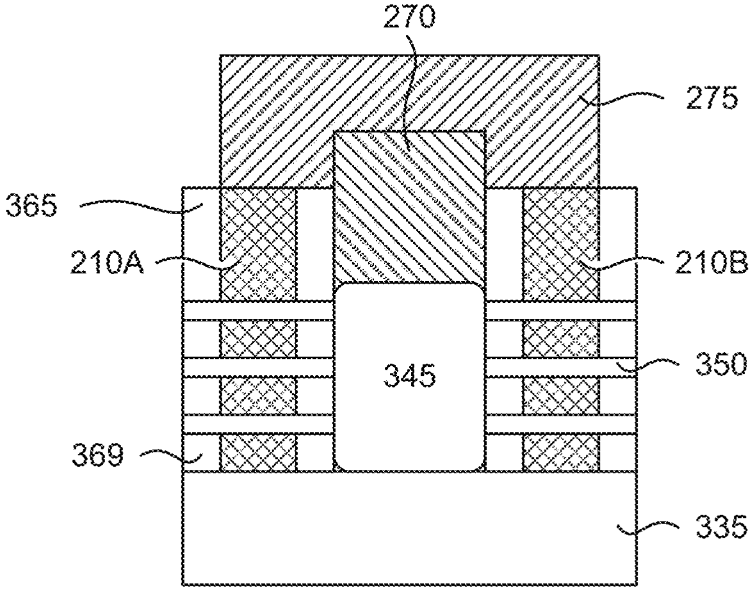

FIG. 6H illustrates stage in which the first backside dielectric 335 may be provided on the lower surfaces of the inner spacers 369, the first and second tie-down gates 210A, 210B, and the tie-down S/D 345.

Figure 6I:
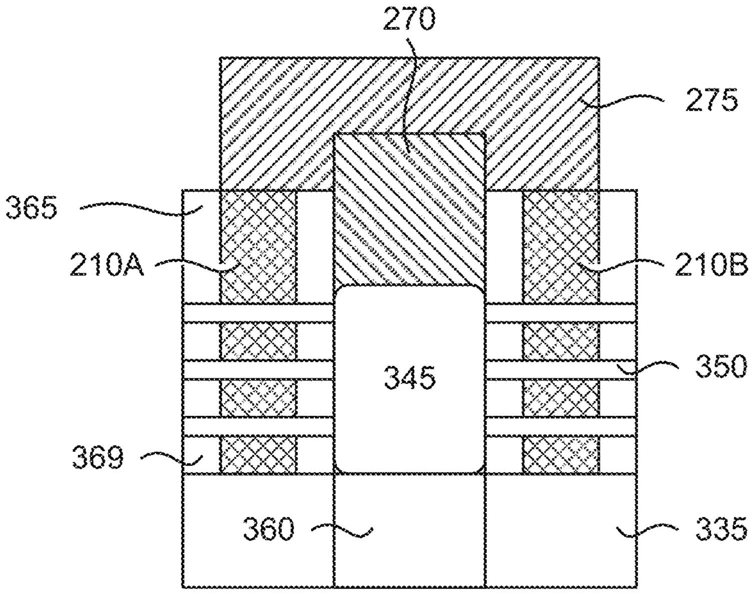

FIG. 6I illustrates stage in which the backside contact 360 may be formed in the first backside dielectric 335.

Figure 6J:
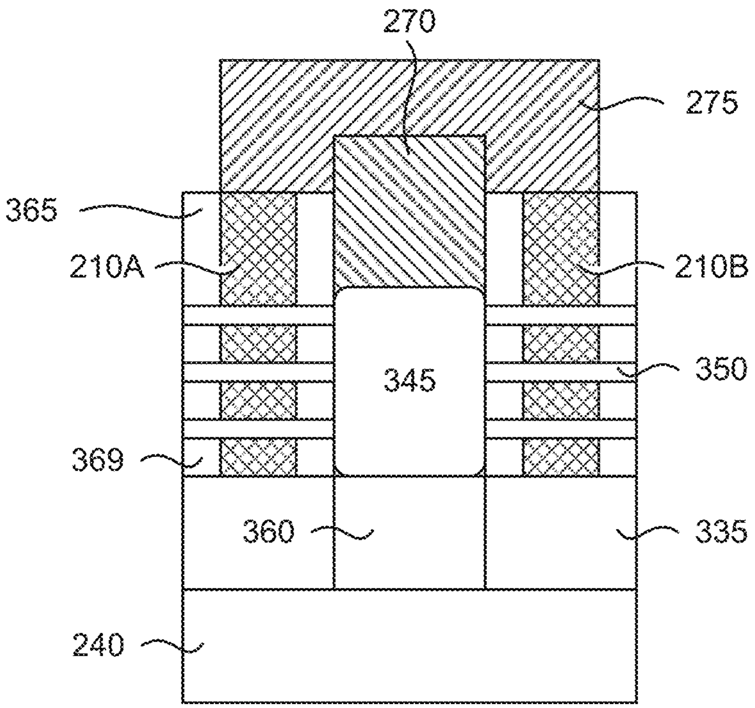

FIG. 6J illustrates stage in which the BSP rail 240 may be formed.

FIGS. 6A-6F may be viewed as representing stages of frontside processing, and FIGS. 6G-6J may be viewed as representing stages of backside processing.

Figure 7:
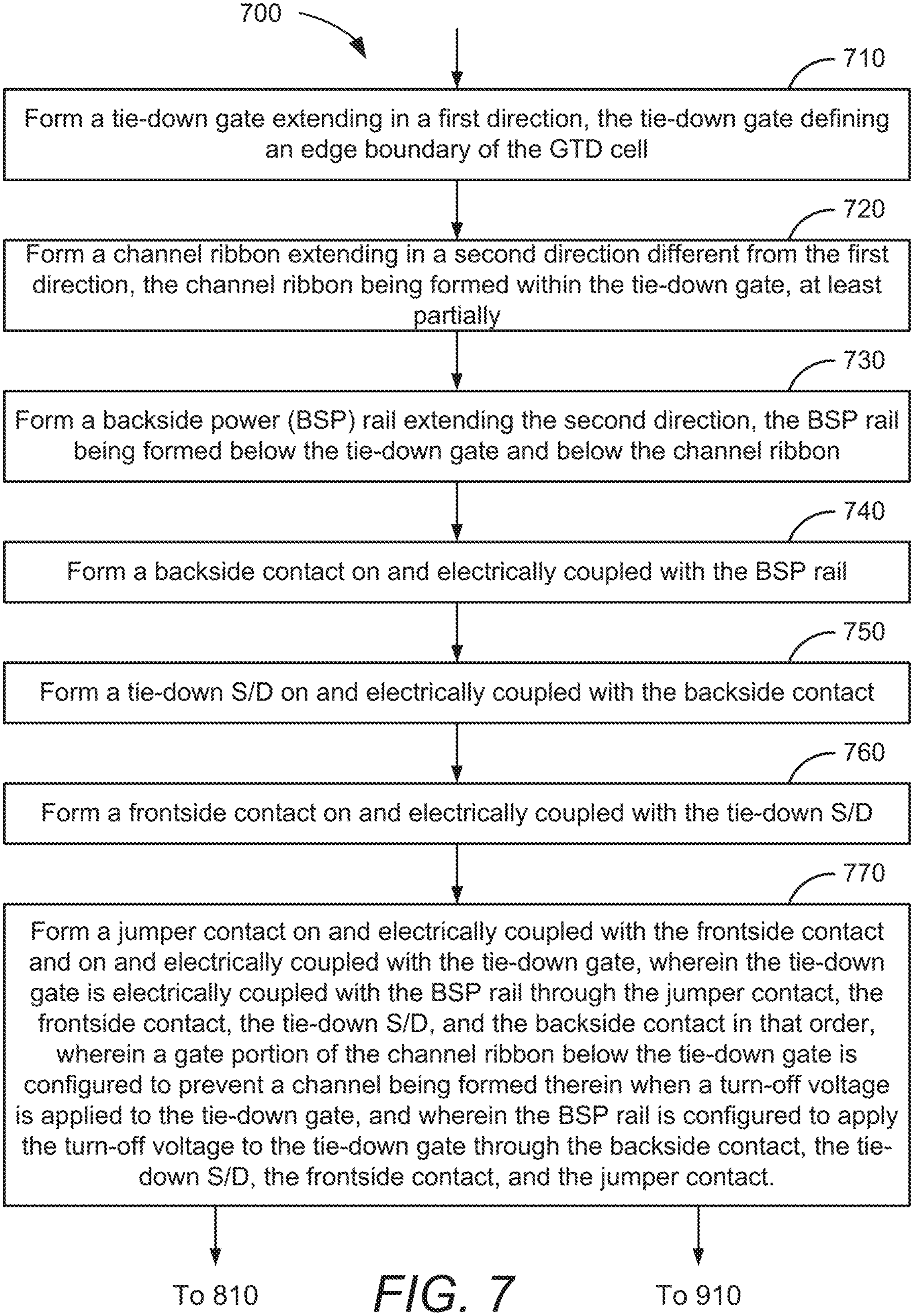
FIGS. 7-9 illustrate flow charts of example methods of fabricating a gate-tie-down cell in accordance with one or more aspects of the disclosure.

FIG. 7 illustrates a flow chart of an example method 700 of fabricating a GTD cell, such as the GTD cell 200, 500 in accordance with one or more aspects of the disclosure. FIG. 7 may include blocks that are common to fabricating both the GTD cells 200, 500.

In block 710, a tie-down gate 210, 210A, 210B extending in a first direction may be formed. The tie-down gate 210, 210A, 210B may define an edge boundary of the GTD cell 200, 500.

In block 720, a nano ribbon 350 extending in a second direction may be formed. The nano ribbon 350 may be formed within the tie-down gate 210, 210A, 210B, at least partially. The first and second directions may be different.

In block 730, a BSP rail 240 extending in the second direction may be formed below the tie-down gate 210, 210A, 210B and below the nano ribbon 350.

In block 740, a backside contact 360 may be formed on and electrically coupled with the BSP rail 240.

In block 750, a tie-down S/D 345 may be formed on and electrically coupled with the backside contact 360. The tie-down S/D 345 may be coupled with the nano ribbon 350.

In block 760, a frontside contact 270 may be formed on and electrically coupled with the tie-down S/D 345.

In block 770, a jumper contact 275 may be formed on and electrically coupled with the frontside contact 270 and on and electrically coupled with the tie-down gate 210, 210A, 210B.

Figure 8:
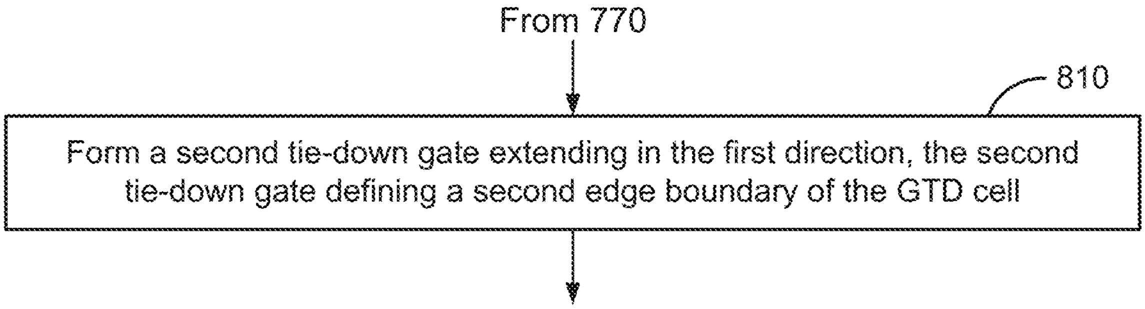

The method 700 may then proceed to block 810 of FIG. 8 for the first embodiment GTD cell 200. In this instance, the tie-down gate, the gate portion, the channel, and the edge boundary discussed with respect to FIG. 7 may respectively be the first tie-down gate 210A, the first gate portion, the first channel, and the first edge boundary. In block 810, a second tie-down gate 210B maybe formed and extend in the first direction. The second tie-down gate 210B may define a second edge boundary of the GTD cell 200. A second gate portion of the nano ribbon 350 within the second tie-down gate 210B may be configured to prevent a second channel being activated therein when the turn-off voltage is applied to the second tie-down gate 210B.

Figure 9:
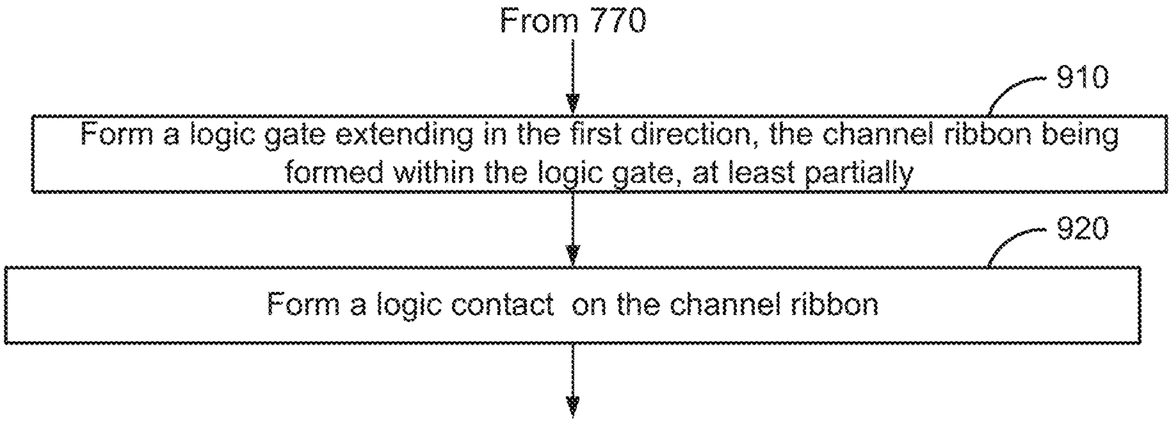

From block 770, the method 700 may then proceed to block 910 of FIG. 9 for the second embodiment GTD cell 500. In block 910, a logic gate 520 extending in the first direction may be formed. The nano ribbon 350 may be formed within the logic gate 520, at least partially.

In block 920, a logic contact 570 may be formed.

The following should be noted regarding the flow indicated in FIGS. 7-9. Unless otherwise indicated, the flow of blocks do not necessarily limit the ordering in which the blocks may be performed. In otherwise, the blocks may be performed in any order that is logical.

Figure 10:
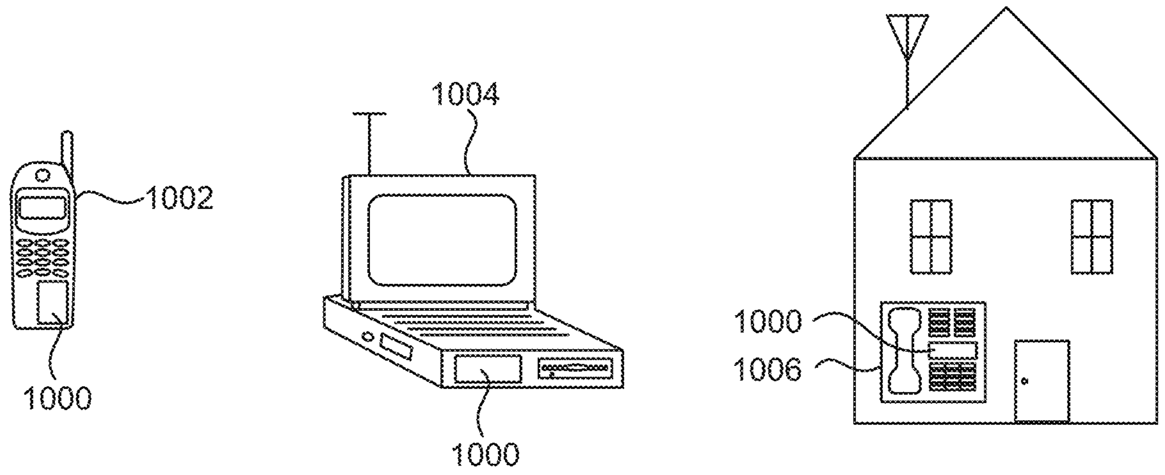
FIG. 10 illustrates various electronic devices which may utilize one or more aspects of the disclosure.

FIG. 10 illustrates various electronic devices 1000 that may be integrated with any of the aforementioned GAA devices in accordance with various aspects of the disclosure. For example, a mobile phone device 1002, a laptop computer device 1004, and a fixed location terminal device 1006 may each be considered generally user equipment (UE) and may include one or more cells (e.g., cells 200, 500) as described herein. The devices 1002, 1004, 1006 illustrated in FIG. 10 are merely exemplary. Other electronic devices may also include the die packages including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

The foregoing disclosed devices and functionalities may be designed and configured into computer files (e.g., RTL, GDSII, GERBER, etc.) stored on computer-readable media. Some or all such files may be provided to fabrication handlers who fabricate devices based on such files. Resulting products may include semiconductor wafers that are then cut into semiconductor die and packaged into an antenna on glass device. The antenna on glass device may then be employed in devices described herein.

Implementation examples are described in the following numbered clauses:

Clause 1: A gate-tie-down (GTD) cell, comprising: a gate extending in a first direction, the gate defining an edge of the GTD cell; a nano ribbon extending in a second direction different from the first direction, the nano ribbon being formed within the gate at least partially; a backside power (BSP) rail extending in the second direction, the BSP rail being formed below the gate and below the nano ribbon; a backside contact on and electrically coupled with the BSP rail; a source/drain (S/D) on and electrically coupled with the backside contact; a frontside contact on and electrically coupled with the S/D; and a jumper contact on and electrically coupled with the frontside contact and on and electrically coupled with the gate, wherein the gate is electrically coupled with the BSP rail through the jumper contact, the frontside contact, the S/D, and the backside contact.

Clause 2: The GTD cell of clause 1, wherein the first and second directions are orthogonal to each other.

Clause 3: The GTD cell of any of clauses 1-2, wherein the jumper contact is in direct contact with one or both of the gate and the frontside contact, the frontside contact is in direct contact with the S/D, the S/D is in direct contact with the backside contact, the backside contact is in direct contact with the BSP rail, or any combination thereof.

Clause 4: The GTD cell of any of clauses 1-3, wherein the gate is a first gate and the edge is a first edge, wherein the GTD cell further comprises a second gate extending in the first direction, the second gate defining a second edge of the GTD cell, the nano ribbon being formed within the second gate at least partially, wherein the backside contact, the S/D, and the frontside contact are horizontally in between the first and second gates, wherein the jumper contact is formed on and electrically coupled with the second gate, and wherein the second gate is electrically coupled with the BSP rail through the jumper contact, the frontside contact, the S/D, and the backside contact.

Clause 5: The GTD cell of clause 4, wherein the jumper contact is in direct contact with the second gate.

Clause 6: The GTD cell of any of clauses 1-5, further comprising: a logic gate extending in the first direction, the nano ribbon being formed within the logic gate at least partially; and a logic contact, wherein the backside contact, the S/D, and the frontside contact are horizontally in between the gate and the logic gate, and wherein the logic gate is horizontally in between the frontside contact and the logic contact.

Clause 7: The GTD cell of clause 6, wherein the logic gate is not electrically coupled to the BSP rail.

Clause 8: The GTD cell of any of clauses 1-7, wherein the GTD cell is configured to abut another GTD cell such that the gate is a common gate to the GTD cell and to the another GTD cell, wherein the another GTD cell comprises: another backside contact on and electrically coupled with the BSP rail; another S/D on and electrically coupled with the another backside contact; and another frontside contact on and electrically coupled with the another S/D, and wherein the jumper contact is on and electrically coupled with the another frontside contact.

Clause 9: The GTD cell of clause 8, wherein the jumper contact is in direct contact with the another frontside contact, the another frontside contact is in direct contact with the another S/D, the another S/D is in direct contact with the another backside contact, the another backside contact is in direct contact with the BSP rail, or any combination thereof.

Clause 10: The GTD cell of any of clauses 1-9, wherein the backside contact is formed from any one or more of copper (Cu), cobalt (Co), tungsten (W), molybdenum (Mo), ruthenium (Ru), titanium aluminide (TiAl), and titanium nitride (TiN).

Clause 11: The GTD cell of any of clauses 1-10, wherein the GTD cell is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

Clause 12: A method of fabricating a gate-tie-down (GTD) cell, the method comprising: forming a gate extending in a first direction, the gate defining an edge of the GTD cell; forming a nano ribbon extending in a second direction different from the first direction, the nano ribbon being formed within the gate at least partially; forming a backside power (BSP) rail extending in the second direction, the BSP rail being formed below the gate and below the nano ribbon; forming a backside contact on and electrically coupled with the BSP rail; forming a source/drain (S/D) on and electrically coupled with the backside contact; forming a frontside contact on and electrically coupled with the S/D; and forming a jumper contact on and electrically coupled with the frontside contact and on and electrically coupled with the gate, wherein the gate is electrically coupled with the BSP rail through the jumper contact, the frontside contact, the S/D, and the backside contact.

Clause 13: The method of clause 12, wherein the first and second directions are orthogonal to each other.

Clause 14: The method of any of clauses 12-13, wherein the jumper contact is in direct contact with one or both of the gate and the frontside contact, the frontside contact is in direct contact with the S/D, the S/D is in direct contact with the backside contact, the backside contact is in direct contact with the BSP rail, or any combination thereof.

Clause 15: The method of any of clauses 12-14, wherein the gate is a first gate and the edge is a first edge, wherein the method further comprises forming a second gate extending in the first direction, the second gate defining a second edge of the GTD cell, the nano ribbon being formed within the second gate at least partially, wherein the backside contact, the S/D, and the frontside contact are horizontally in between the first and second gates, wherein the jumper contact is formed on and electrically coupled with the second gate, and wherein the second gate is electrically coupled with the BSP rail through the jumper contact, the frontside contact, the S/D, and the backside contact.

Clause 16: The method of clause 15, wherein the jumper contact is in direct contact with the second gate.

Clause 17: The method of any of clauses 12-16, further comprising: forming a logic gate extending in the first direction; and forming a logic contact, wherein the backside contact, the S/D, and the frontside contact are horizontally in between the gate and the logic gate, and wherein the logic gate is horizontally in between the frontside contact and the logic contact.

Clause 18: The method of clause 17, wherein the logic gate is not electrically coupled to the BSP rail.

Clause 19: The method of any of clauses 12-18, wherein the GTD cell is configured to abut another GTD cell such that the gate is a common gate to the GTD cell and to the another GTD cell, wherein the another GTD cell comprises: another backside contact on and electrically coupled with the BSP rail; another S/D on and electrically coupled with the another backside contact; and another frontside contact on and electrically coupled with the another S/D, and wherein the jumper contact is on and electrically coupled with the another frontside contact.

Clause 20: The method of clause 19, wherein the jumper contact is in direct contact with the another frontside contact, the another frontside contact is in direct contact with the another S/D, the another S/D is in direct contact with the another backside contact, the another backside contact is in direct contact with the BSP rail, or any combination thereof.

Clause 21: The method of any of clauses 12-20, wherein the backside contact is formed from any one or more of copper (Cu), cobalt (Co), tungsten (W), molybdenum (Mo), ruthenium (Ru), titanium aluminide (TiAl), and titanium nitride (TiN).

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth® (BT), Bluetooth® Low Energy (BLE), IEEE 802.11 (Wi-Fi®), and IEEE 802.15.4 (Zigbee/Thread) or other protocols that may be used in a wireless communications network or a data communications network. Bluetooth® Low Energy (also known as Bluetooth® LE, BLE, and Bluetooth® Smart) is a wireless personal area network technology designed and marketed by the Bluetooth® Special Interest Group intended to provide considerably reduced power consumption and cost while maintaining a similar communication range. BLE was merged into the main Bluetooth® standard in 2010 with the adoption of the Bluetooth® Core Specification Version 4.0 and updated in Bluetooth® 5.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described herein can be configured to perform at least a portion of a method described herein.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or one or more claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into one or more sub-actions or contain one or more sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A gate-tie-down (GTD) cell, comprising:

a gate extending in a first direction, the gate defining an edge of the GTD cell;

a nano ribbon extending in a second direction different from the first direction, the nano ribbon being formed within the gate at least partially;

a backside power (BSP) rail extending in the second direction, the BSP rail being formed below the gate and below the nano ribbon;

a backside contact on and electrically coupled with the BSP rail;

a source/drain (S/D) on and electrically coupled with the backside contact;

a frontside contact on and electrically coupled with the S/D; and a jumper contact on and electrically coupled with the frontside contact and on and electrically coupled with the gate, wherein the gate is electrically coupled with the BSP rail through the jumper contact, the frontside contact, the S/D, and the backside contact, and wherein the jumper contact is in direct contact with an entirety of an upper surface of the frontside contact.

2. The GTD cell of claim 1, wherein the first and second directions are orthogonal to each other.

3. The GTD cell of claim 1, wherein the jumper contact is in direct contact with both of the gate and the frontside contact, the frontside contact is in direct contact with the S/D, the S/D is in direct contact with the backside contact, the backside contact is in direct contact with the BSP rail, or any combination thereof.

4. The GTD cell of claim 1, wherein the gate is a first gate and the edge is a first edge, wherein the GTD cell further comprises a second gate extending in the first direction, the second gate defining a second edge of the GTD cell, the nano ribbon being formed within the second gate at least partially, wherein the backside contact, the S/D, and the frontside contact are horizontally in between the first and second gates, wherein the jumper contact is formed on and electrically coupled with the second gate, and wherein the second gate is electrically coupled with the BSP rail through the jumper contact, the frontside contact, the S/D, and the backside contact.

5. The GTD cell of claim 4, wherein the jumper contact is in direct contact with the second gate.

6. The GTD cell of claim 1, further comprising:

a logic gate extending in the first direction, the nano ribbon being formed within the logic gate at least partially; and a logic contact, wherein the backside contact, the S/D, and the frontside contact are horizontally in between the gate and the logic gate, and wherein the logic gate is horizontally in between the frontside contact and the logic contact.

7. The GTD cell of claim 6, wherein the logic gate is not electrically coupled to the BSP rail.

8. The GTD cell of claim 1, wherein the GTD cell is configured to abut another GTD cell such that the gate is a common gate to the GTD cell and to the another GTD cell, wherein the another GTD cell comprises:

another backside contact on and electrically coupled with the BSP rail;

another S/D on and electrically coupled with the another backside contact; and another frontside contact on and electrically coupled with the another S/D, and wherein the jumper contact is on and electrically coupled with the another frontside contact.

9. The GTD cell of claim 8, wherein the jumper contact is in direct contact with the another frontside contact, the another frontside contact is in direct contact with the another S/D, the another S/D is in direct contact with the another backside contact, the another backside contact is in direct contact with the BSP rail, or any combination thereof.

10. The GTD cell of claim 1, wherein the backside contact is formed from any one or more of copper (Cu), cobalt (Co), tungsten (W), molybdenum (Mo), ruthenium (Ru), titanium aluminide (TiAl), and titanium nitride (TiN).

11. The GTD cell of claim 1, wherein the GTD cell is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IOT) device, a laptop computer, a server, and a device in an automotive vehicle.

12. A method of fabricating a gate-tie-down (GTD) cell, the method comprising:

forming a gate extending in a first direction, the gate defining an edge of the GTD cell;

forming a nano ribbon extending in a second direction different from the first direction, the nano ribbon being formed within the gate at least partially;

forming a backside power (BSP) rail extending in the second direction, the BSP rail being formed below the gate and below the nano ribbon;

forming a backside contact on and electrically coupled with the BSP rail;

forming a source/drain (S/D) on and electrically coupled with the backside contact;

forming a frontside contact on and electrically coupled with the S/D; and forming a jumper contact on and electrically coupled with the frontside contact and on and electrically coupled with the gate, wherein the gate is electrically coupled with the BSP rail through the jumper contact, the frontside contact, the S/D, and the backside contact, and wherein the jumper contact is in direct contact with an entirety of an upper surface of the frontside contact.

13. The method of claim 12, wherein the first and second directions are orthogonal to each other.

14. The method of claim 12, wherein the jumper contact is in direct contact with both of the gate and the frontside contact, the frontside contact is in direct contact with the S/D, the S/D is in direct contact with the backside contact, the backside contact is in direct contact with the BSP rail, or any combination thereof.

15. The method of claim 12, wherein the gate is a first gate and the edge is a first edge, wherein the method further comprises forming a second gate extending in the first direction, the second gate defining a second edge of the GTD cell, the nano ribbon being formed within the second gate at least partially, wherein the backside contact, the S/D, and the frontside contact are horizontally in between the first and second gates, wherein the jumper contact is formed on and electrically coupled with the second gate, and wherein the second gate is electrically coupled with the BSP rail through the jumper contact, the frontside contact, the S/D, and the backside contact.

16. The method of claim 15, wherein the jumper contact is in direct contact with the second gate.

17. The method of claim 12, further comprising:

forming a logic gate extending in the first direction; and forming a logic contact, wherein the backside contact, the S/D, and the frontside contact are horizontally in between the gate and the logic gate, and wherein the logic gate is horizontally in between the frontside contact and the logic contact.

18. The method of claim 17, wherein the logic gate is not electrically coupled to the BSP rail.

19. The method of claim 12, wherein the GTD cell is configured to abut another GTD cell such that the gate is a common gate to the GTD cell and to the another GTD cell, wherein the another GTD cell comprises:

another backside contact on and electrically coupled with the BSP rail;

another S/D on and electrically coupled with the another backside contact; and another frontside contact on and electrically coupled with the another S/D, and wherein the jumper contact is on and electrically coupled with the another frontside contact.

20. The method of claim 19, wherein the jumper contact is in direct contact with the another frontside contact, the another frontside contact is in direct contact with the another S/D, the another S/D is in direct contact with the another backside contact, the another backside contact is in direct contact with the BSP rail, or any combination thereof.

21. The method of claim 12, wherein the backside contact is formed from any one or more of copper (Cu), cobalt (Co), tungsten (W), molybdenum (Mo), ruthenium (Ru), titanium aluminide (TiAl), and titanium nitride (TiN).

* * * * *